(12) United States Patent
Tanikawa

(10) Patent No.: US 6,636,433 B2
(45) Date of Patent: Oct. 21, 2003

(54) ELECTRONIC DEVICE AND RECORDING METHOD USING THE SAME

(75) Inventor: Akio Tanikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 134 days.

(21) Appl. No.: 09/801,325

(22) Filed: Mar. 7, 2001

(65) Prior Publication Data

US 2001/0026468 A1 Oct. 4, 2001

(30) Foreign Application Priority Data

Mar. 21, 2000 (JP) ........................................ 2000-078772

(51) Int. Cl.[7] .............................................. G11C 19/08
(52) U.S. Cl. ........................... 365/36; 365/46; 365/148; 365/178
(58) Field of Search ............................. 365/36, 46, 148, 365/178

(56) References Cited

U.S. PATENT DOCUMENTS 5,363,329 A * 11/1994 Troyan ....................... 365/184
5,714,400 A * 2/1998 Hirao et al. .................. 437/52

FOREIGN PATENT DOCUMENTS

| JP | 2000-223599 | 8/2000 |
| JP | 2002-536840 | 10/2002 |

* cited by examiner

Primary Examiner—Vu A. Le
(74) Attorney, Agent, or Firm—Michael, Best & Friedrich LLC

(57) ABSTRACT

An electronic device of the present invention includes a memory core formed on an insulative substrate and implemented by a substance that performs, when a current flows therethrough, electromigration and varies in at least part of its shape or at least part of its element composition ratio. Two electrodes are directly bonded to opposite ends of the memory core. A sense electrode is spaced from the memory core by a thin insulative film in the vicinity of one of the two electrodes. A current flowing through the memory core causes a diffusion element to concentrate around either one of the two electrodes, whereby data is written in the memory core. Charge migration from the sense electrode caused by the migration of the diffusion element is sensed to thereby read the data out of the memory core.

25 Claims, 18 Drawing Sheets

FIG. 13

ELECTRONIC DEVICE AND RECORDING METHOD USING THE SAME

BACKGROUND OF THE INVENTION

The present invention relates to an electronic device and a recording method using the same. More particularly, the present invention relates to an electronic device including a memory core formed of a substance that varies, when a current flows therethrough, in at least part of its shape or at least part of its element composition ratio, and a recording method using the same.

Hard disks, floppy disks, magneto-optic disks and other magnetic recording media and flash memories (floating-gate transistors), ferroelectric RAMs (Random Access Memories) and other semiconductor memories belong to a family of writable memories that store data even when power is shut off. Further, Japanese Patent Laid-Open Publication No. 6-28841 discloses a memory using the electromechanical reaction of an electrolyte, although such a memory is not extensively used yet.

While a magnetic recording medium has a large storage capacity, it is not practical without resorting to a rotary or similar mechanically movable portion. In addition, a high-precision mechanism using precision parts is necessary for writing and reading data out of a magnetic recording medium. Therefore, a recording apparatus using this kind of recording medium is susceptible to shocks and impacts and limited in compactness.

A semiconductor memory is compact and allows data to be extremely rapidly written and read thereoutof. A semiconductor memory, however, needs a sophisticated production line and high cost and cannot attain a storage capacity comparable with the capacity of a magnetic recording medium.

A memory using the electromechanical reaction of an electrolyte is slow in writing and reading and lacks the long-term durability of the individual device.

Technologies relating to the present invention are also disclosed in, e.g., Japanese Patent Laid-Open Publication No. 58-178333 and Japanese Patent Application Publication No. 9-506049.

SUMMARY OF THE INVENTION

It is therefore an object of the present invention to provide an electronic device superior even to a magnetic recording medium as to storage capacity and reading and writing speeds, producible at a low cost, and as compact as a semiconductor memory.

In accordance with the present invention, in an electronic device, a memory core is formed of a substance that performs, when a current flows therethrough, electromigration and varies in at least part of its shape or at least part of its element composition ratio.

Also, in accordance with the present invention, in an integrated electronic device comprising a plurality of electronic devices, each of which includes a memory core formed of the above-described substance, arranged on a single substrate in rows and columns, the electronic devices each further includes a first electrode for causing the current to flow through the memory core and either one of a second electrode for sensing the surface potential of the memory core and a third electrode for sensing the electric resistance or the junction resistance of the memory core. A bit line and a word line connected to one of the first to third electrodes are selected to thereby designate associated one of the electronic devices to be accessed.

Further, in accordance with the present invention, in a method of writing data in an electronic device including a memory core formed of a substance of the kind described above, the electronic device further includes a first electrode for causing the current to flow through the memory core and either one of a second electrode for sensing the surface potential of the memory core and a third electrode for sensing the electric resistance or the junction resistance of the memory core.

Moreover, in accordance with the present invention, in a method of reading data out of an electronic device including a memory core formed of a substance of the kind described above, the electronic device further includes a first electrode for causing the current to flow through the memory core and either one of a second electrode for sensing the surface potential of the memory core and a third electrode for sensing the electric resistance or the junction resistance of the memory core. The second electrode is insulated from the memory core. The amount of charge migration to occur in the second electrode is sensed to thereby read the data out of the memory core.

BRIEF DESCRIPTION OF THE DRAWINGS

The above and other objects, features and advantages of the present invention will become more apparent from the following detailed description taken with the accompanying drawings in which:

FIG. 13 is a periodic table listing the surface potentials of elements;

DESCRIPTION OF THE PREFERRED EMBODIMENTS

Figure 1A:
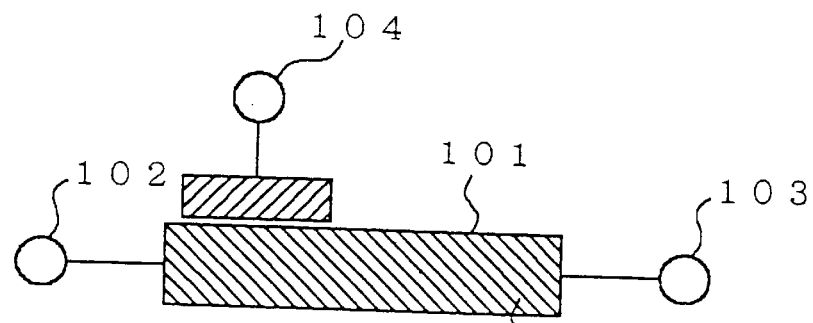
FIGS. 1A through 1C are fragmentary sections showing an electronic device embodying the present invention.

A first principle of the present invention will be described first. The present invention uses electromigration that is one of the causes of trouble of aluminum wiring laid in LSIs (Large Scale Integrated circuits), as well known in the art. The electromigration of aluminum wiring can be observed only when an extremely high current density is applied thereto over a long period of time. Although the self-diffusion coefficient of aluminum is small, electromigration deteriorates the long-term stability of a LSI chip having an extremely small sectional area ($10^{-12}$ m$^2$ or less) and including fine wiring, which is sometimes as long as several meters. Electromigration causes wiring to partly snap off when a LSI is used over a long period of time.

More specifically, when a high-density current flows through the wiring of a LSI over a long period of time, the element constituting the wiring migrates. As a result, voids locally appear in the wiring or the wiring snaps off. It has been reported that electromigration causes an element to migrate at a rate proportional to current density and diffusion coefficient.

While the present invention is practicable with any conductive substance (element) expected to perform electromigration, a memory device comparable in rapid reading and writing with the previously stated conventional memories is not attainable with aluminum. Use must be made of a substance having a high element migration rate, i.e., a sufficiently great diffusion coefficient. In—Au (Au being the diffusion element), Sn—Ni (Ni being the diffusion element) or similar alloy meets the above requirement. Such a diffusion element has a diffusion coefficient $10^{10}$ times as great as the self-diffusion coefficient of aluminum at room temperature.

In accordance with the present invention, a memory core formed of the above-mentioned substance is provided with electrodes at opposite ends thereof. A current is fed to the memory core via the electrodes in order to cause the diffusion element to migrate to one end of the core or to concentrate, thereby storing data. When the polarity of the current is reversed, the element restores its original state with the result that the data is deleted. Of course, the migration or concentration and the restoration of the original state may be representative of deletion and storage, respectively.

Alternatively, to write data in the memory core, the core may be bodily biased to one side in order to form a void at the other side. Further, the memory core may be implemented by a carbon nano-tube provided with electrodes at opposite ends thereof for feeding current. The carbon nano-tube has a hollow core in part of which metal atoms are inserted. In this case, data can be written if the metal atoms are caused to migrate.

When importance is attached to a data holding ability, the memory core must be made of a substance having a relatively small diffusion coefficient at room temperature. Sufficiently rapid writing is achievable despite the use of such a substance if the temperature of the memory core is raised only at the time of writing. The writing speed can be further increased if the memory core is heated to such a level that it at least partly fuses. The memory core can be heated by Joule heat derived from the current during writing, i.e., without resorting to an exclusive heater.

The temperature elevation of the memory core relying on Joule heat needs an adequate device design. Specifically, a structure in which part of the memory core to be heated is reduced in sectional area and a structure in which a non-diffusible element is added to the above part of the memory core for increasing resistance are useful.

Figure 13:
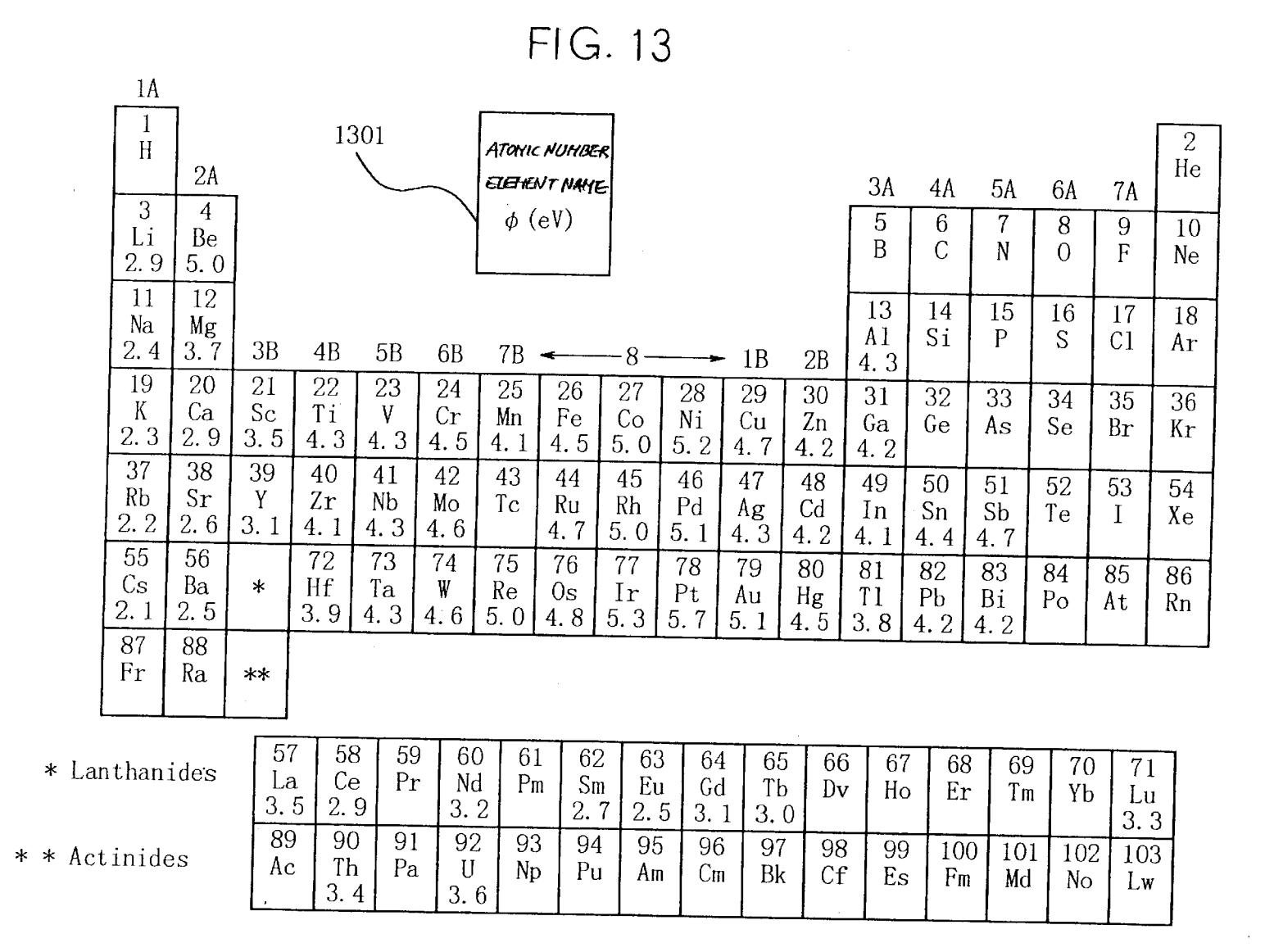

A second principle of the present invention pertains to a data reading method. One of conventional methods of detecting the partial concentration of an alloy composition is to sense the surface potential (or work function) of a conductor. The surface potential of a conductor depends on the composition of the conductor. FIG. 13 shows the surface potentials of various conductors in a periodic table ($\emptyset$ (ev) 1301). As for alloys, the surface potential is considered to be the intermediate between the surface potentials of constituent elements.

Figure 14A:
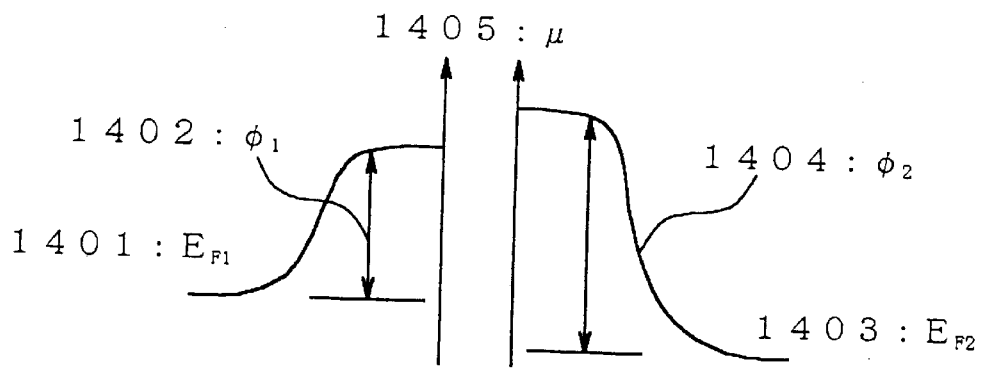
FIGS. 14A and 14B show a specific method of measuring a surface potential.
Figure 14B:
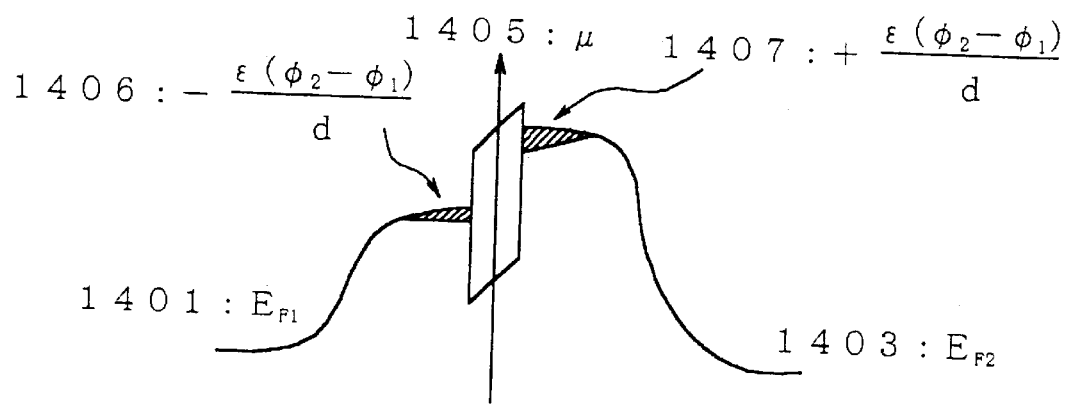

FIGS. 14A and 14B show a specific method of measuring the surface potential. FIG. 14A shows two conductors having surface potentials 1402 of $\emptyset_1$ and 1404 of $\emptyset_2$, respectively. As shown in FIG. 14B, assume that the two conductors are brought close to each other, but spaced by a distance d by a thin insulative layer having a dielectric constant $\epsilon$. Then, the surface charge density of the individual conductor varies by $+\epsilon(\emptyset_2-\emptyset_1)/d$ due to the difference in surface potential. In accordance with the present invention, when the alloy composition of a substance applied to the memory core varies, one of the surface potentials $\emptyset_1$ and $\emptyset_2$ varies with the result that the charge migrates. By detecting the charge migration, it is possible to read data out of the memory core. There are also shown in FIGS. 14A and 14B Fermi levels 1401 and 1403 respectively particular to the conductors whose surface potentials are $\emptyset_1$ and $\emptyset_2$, a potential coordinate axis 1405 using vacuum as a reference, a charge 1406 increased in the above condition, and a charge 1407 decreased in the same condition.

Figure 15A:
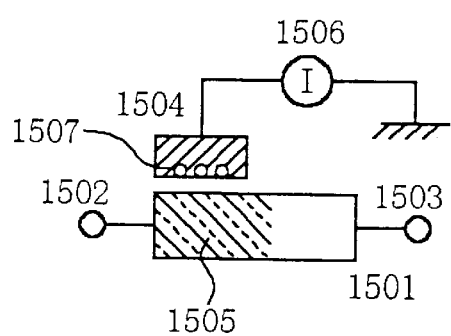
FIGS. 15A through 15D are views illustrating a principle of operation unique to the present invention.
Figure 15B:
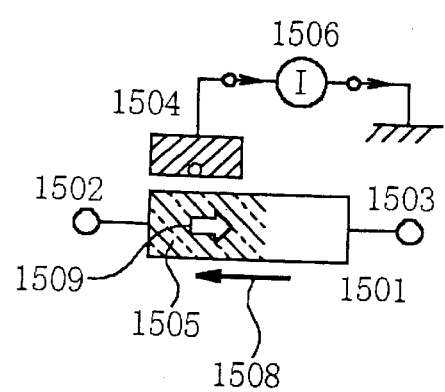

FIG. 15A shows a memory core 1501 formed of an alloy, electrodes 1502 and 1503 for feeding current, and a sense electrode 1504 adjoining the electrode 1502 and spaced from the memory core 1501 by a thin insulative film not shown. Assume that the concentration of a diffusion element 1505 at the sense electrode 1504 side is representative of the recording of (logical) ONE, and that the other condition is representative of the recording of (logical) ZERO. As shown in FIG. 15B, current 1508 is caused to flow from the electrode 1503 to the electrode 1502 via the memory core 1501 in the direction of ZERO recording. At this instant, if the memory core 1501 has a ONE recording status, then the concentrated diffusion element 1505 migrates in a direction indicated by an arrow 1509. The resulting variation of surface potential causes the charge 1507 of the sense electrode 1504 to move.

Figure 15C:
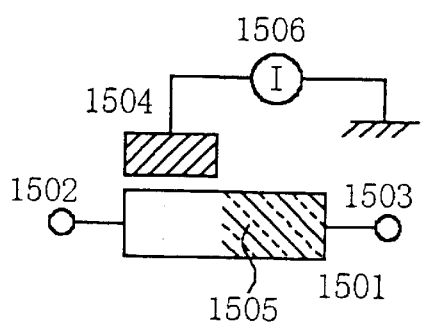
Figure 15D:
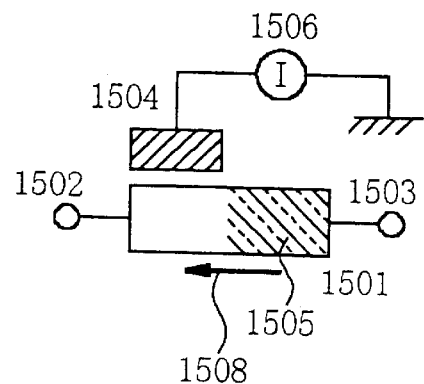

On the other hand, as shown in FIG. 15C, assume that the memory core 1501 has a ZERO recording status. Then, as shown in FIG. 15D, the surface potential varies little, so that the charge 1507 of the sense electrode 1504 moves little. The movement of the charge 1507 is sensed in terms of current by an ammeter 1506 or in terms of voltage. Only when the memory core 1501 is determined to have had a ONE recording status, current that restores the ONE recording status is caused to flow through the core 1501. This is successful to read data out of the memory core 1501 while holding the data in the core 1501.

Figure 16A:
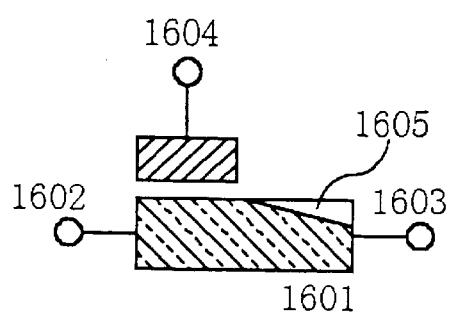
FIGS. 16A and 16B are views illustrating another specific principle of operation unique to the present invention.
Figure 16B:
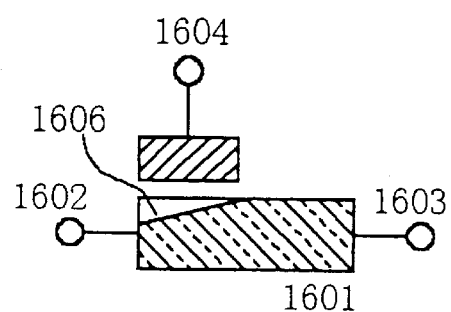

For a memory core of the type forming a void, a sense electrode is positioned in the vicinity of one of opposite electrodes and spaced from the memory core by a thin insulative film. Whether or not a void is present can be determined by sensing the variation of capacitance between the sense electrode and the memory core. Specifically, as shown in FIG. 16A, assume that a void 1605 is absent at the side of a memory core 1601 where a sense electrode 1604 is positioned (electrode 1602 side). Then, capacitance between the sense electrode 1604 and the memory core 1601 is greater than when a void 1606 is present in the vicinity of the electrode 1602, as shown in FIG. 16B. To sense such a variation of capacitance, a voltage may be applied between the sense electrode 1604 and the memory core 1601 in order to compare the amounts of charge to ingress and egress. In FIGS. 16A and 16B, the reference numeral 1603 designates an electrode positioned at the opposite to the electrode 1602.

Figure 17A:
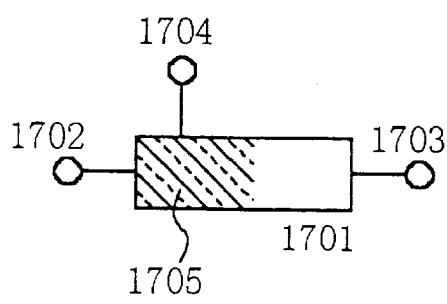
FIGS. 17A and 17B are views illustrating still another specific principle of operation unique to the present invention.
Figure 17B:
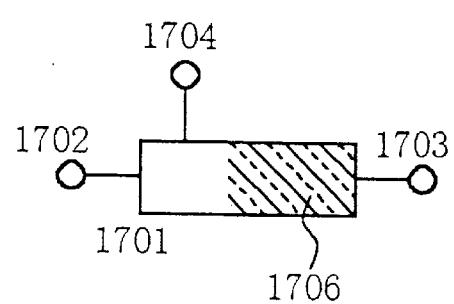

The local concentration of the alloy composition may alternatively be detected in terms of the variation of junction resistance or electric resistance. Specifically, as shown in FIGS. 17A and 17B, a sense electrode 1704 implemented by a densely doped semiconductor is directly bonded to part of a memory core 1701 adjoining an electrode 1702, so that junction resistance greatly varies. The junction resistance of the sense electrode 1704 noticeably varies in accordance with the height of a Schottky barrier, which varies with the variation of density of a diffusion element 1705 or 1706 concentrating at the side of the electrode 1702 or an electrode 1703. By sensing such a variation of junction resistance, it is possible to read data out of the memory core 1701.

Figure 18A:
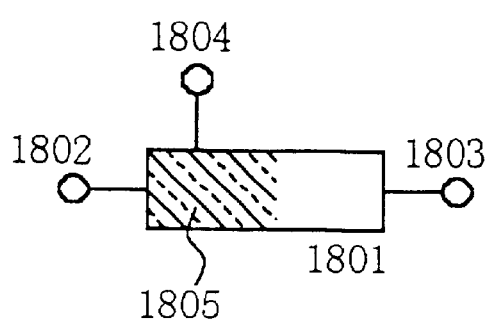
FIGS. 18A and 18B are views illustrating yet another specific principle of operation unique to the present invention.
Figure 18B:
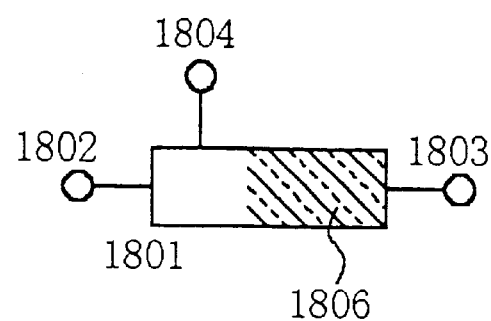

An alloy has, in many cases, higher resistance than a single metal. FIGS. 18A and 18B respectively show a condition wherein a diffusion element 1805 concentrates at the side of an electrode 1802 and a condition wherein a diffusion element 1806 concentrates at the side of an electrode 1803. A memory core 1801 exhibits lower resistance at the side where the diffusion element concentrates than at the other side. It is therefore possible to sense the local concentration of the alloy composition if a sense electrode 1804 is electrically connected to the intermediate point of the memory core 1801 in order to compare resistance between the electrode 1802 and the memory core 1801.

Figure 19A:
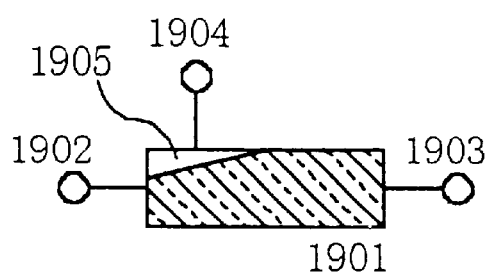
FIGS. 19A and 19B are views illustrating a further specific principle of operation unique to the present invention.
Figure 19B:
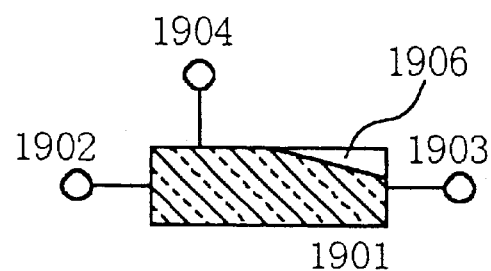

Alternatively, as shown in FIGS. 19A and 19B, a sense electrode 1904 may be directly bonded to a memory core 1901 in the vicinity of an electrode 1902. In this case, the sense electrode 1904 will sense disconnection or increase in resistance between the sense electrode 1904 and the memory core 1901.

The structures and principles described above derive a great number of applications, e.g., a structure including additional electrodes and a method that is the combination of two or more of the reading methods.

Preferred embodiments of the electronic device in accordance with the present invention will be described hereinafter.

Figure 1B:
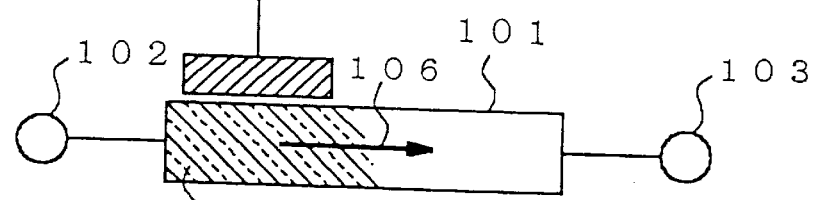
Figure 1C:
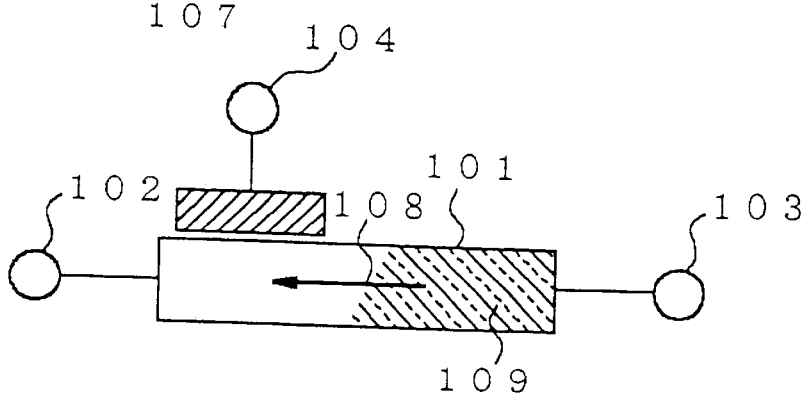

Referring to FIGS. 1A through 1C, an electronic device representative of a first embodiment is shown. As shown in FIG. 1A, the electronic device includes a memory core 101 formed on an insulative substrate, not shown, and formed of a conductive alloy that contains two or more elements. Electrodes 102 and 103 are directly bonded to opposite ends of the memory core 101. A sense electrode 104 adjoins the memory core 101 in the vicinity of the electrode 102, but is spaced from the core 101 by a thin, insulative film not shown. Just after the fabrication of the device, the atoms of the diffusion element included in the memory core 101 are uniformly distributed over the entire core 101. The diffusion element uniformly distributed in the memory core 101 is labeled 105 in FIG. 1A.

FIGS. 1B and 1C show how data is written to the electronic device of FIG. 1A. As shown in FIG. 1B, assume that a current 106 is caused to flow from the electrode 102 to the electrode 103. Then, on the elapse of a certain period of time, the diffusion element in the memory core 101 concentrates at the electrode 102 side. As a result, the density of the diffusion element increases around the sense electrode 104, as indicated by the reference numeral 107. Conversely, as shown in FIG. 1C, assume that a current 108 is caused to flow from the electrode 103 to the electrode 102. Then, on the elapse of a certain period of time, the diffusion element in the memory core 101 concentrates at the electrode 103 side. As a result, the density of the diffusion element decreases around the sense electrode 104, as indicated by the reference numeral 109. By such electromigration, data is written to the memory core 101.

To determine the status of the memory core 101, charge migration from the sense electrode 104 may be detected. For example, when the current 106 is caused to flow from the electrode 102 to the electrode 103, substantially no charge migrates from the sense electrode 104 because the diffusion element densely gathers around the sense electrode 104. On the other hand, as shown in FIG. 1C, the current flowing from the electrode 103 to the electrode 102 causes charge to migrate from the sense electrode 104 because the diffusion element exists little around the sense electrode 104. Whether or not charge migrates from the sense electrode 104 is indicative of the status of the memory core 101. It is to be noted that when charge migration is detected, it is necessary to cause current to flow in the opposite direction to the current used for detection for thereby restoring the memory core 101 to the original condition.

Figure 2A:
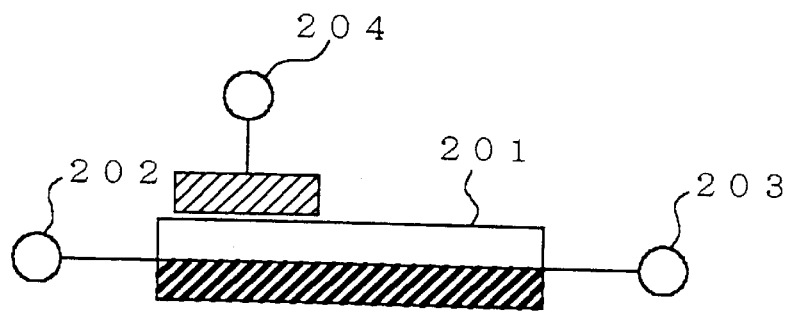
FIGS. 2A through 2C are fragmentary sections showing an alternative embodiment of the present invention.
Figure 2B:
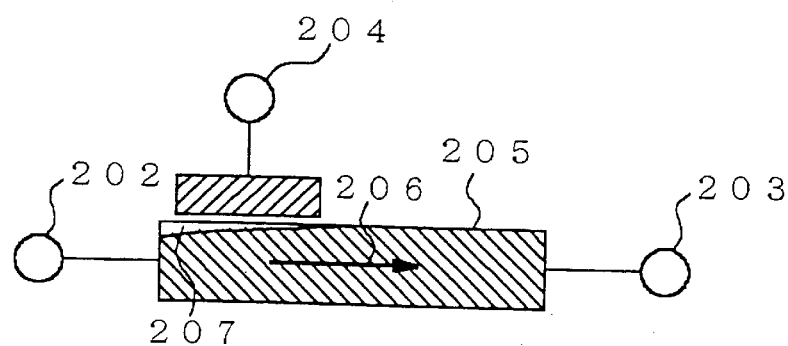
Figure 2C:
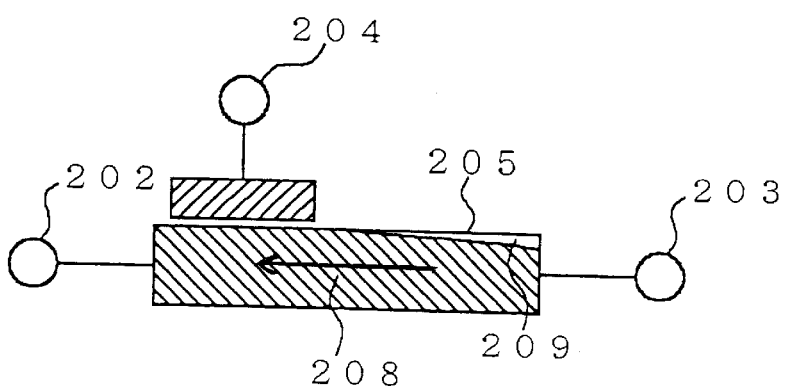

FIGS. 2A through 2C show a second embodiment of the electronic device in accordance with the present invention. As shown in FIG. 2A, the electronic device also includes a memory core 201 formed on an insulative substrate, not shown, and formed of a conductive alloy that contains two or more elements. The memory core 201 is shown in a condition just after fabrication and as being made up of two layered components. Electrodes 202 and 203 are directly bonded to opposite ends of the memory core 201. A sense electrode 204 adjoins the memory core 201 in the vicinity of the electrode 202, but is spaced from the core 201 by a thin, insulative film not shown. After the entire memory core 201 has been covered with an insulation layer not shown, the two or more layers are mixed together by heat or electromigration.

The volume of the memory core 201 just after the fabrication decrease due to the mixture. As a result, a void 207 shown in FIG. 2B or a void 209 shown in FIG. 2C appears in the vicinity of the electrode 202 or 203, respectively. To cause the void 207 or 209 to appear at the sense electrode 204 side, the sides and top of the memory core 201 are covered with an insulator exhibiting energy at the interface between the insulator and the core 201 that is greater than energy at the interface between the core 201 and the substrate.

FIGS. 2B and 2C demonstrate how data is read out of the electronic device of FIG. 2A. The method to be described is based on capacitance between the sense electrode 204 and the memory core 201 that varies in accordance with the presence/absence of the void 207 or 209. Specifically, as shown in FIG. 2B, when the void 208 is present in the vicinity of the sense electrode 204, capacitance between the sense electrode 204 and the memory core, labeled 205, decreased in volume due to mixture is relatively small. Conversely, as shown in FIG. 2C, when the void is absent in the vicinity of the sense electrode 204, the above capacitance is relatively great. Data is read out of the electronic device on the basis of such a difference in the position of the void. A current flowing from the electrode 202 to the electrode 203 and a current flowing from the latter to the former are designated by the reference numerals 206 and 208 in FIGS. 2B and 2C, respectively. Data is written to the electronic device in the same manner as in the first embodiment.

Figure 3A:
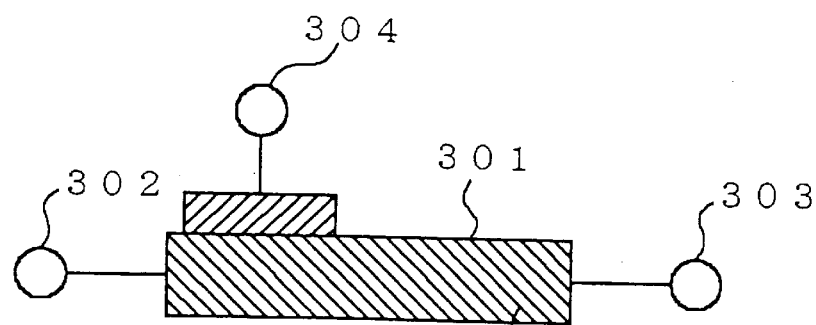
FIGS. 3A through 3C are fragmentary sections showing another alternative embodiment of the present invention.
Figure 3B:
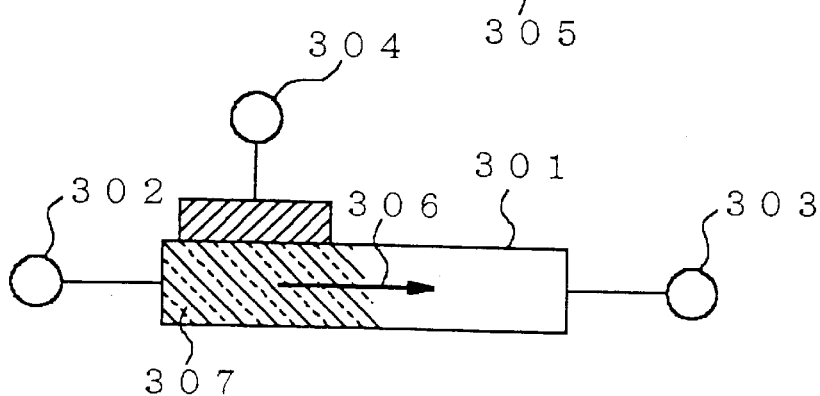
Figure 3C:
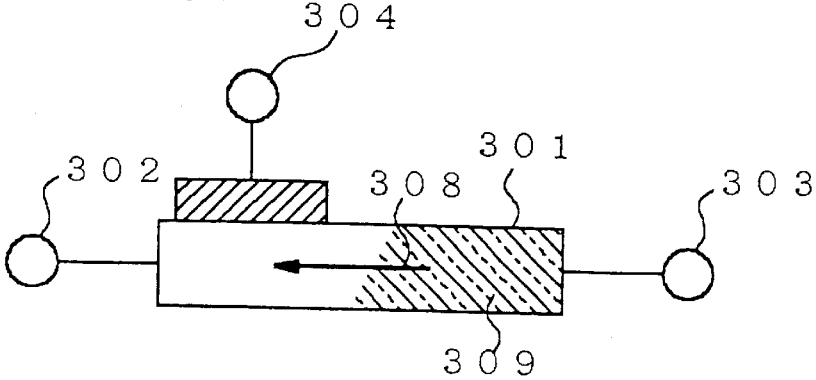

FIGS. 3A through 3C show a third embodiment of the electronic device in accordance with the present invention. As shown in FIG. 3A, the electronic device includes a memory core 301 formed on an insulative substrate, not shown, and formed of a conductive alloy that consists of two or more elements. Electrodes 302 and 303 are directly bonded to opposite ends of the memory core 301. A sense electrode 304 is also directly bonded to the memory core 301 in the vicinity of the electrode A302 and implemented by a densely doped semiconductor. Just after fabrication, the atoms of a diffusion element contained in the memory core 301 are uniformly distributed over the entire core 301, as indicated by the reference numeral 305.

Data is read out of the electronic device shown in FIG. 3A on the basis of the variation of junction resistance of the sense electrode 304. Specifically, as shown in FIG. 3B, when a diffusion element 307 with a high Schottky barrier densely concentrates in the vicinity of the sense electrode 304, junction resistance between the sense electrode 304 and the memory core 301 is relatively high. Conversely, as shown in FIG. 3C, assume that the density of the above element in the vicinity of the sense electrode 304 is low, i.e., the concentrated element, labeled 309, exists at the electrode 303 side. Then, the junction resistance between the sense electrode 304 and the memory core 301 is relatively low. Data is read out of the electronic device on the basis of such a difference in junction resistance. A current flowing from the electrode 302 to the electrode 303 and a current flowing from the latter to the former are designated by the reference numerals 306 and 308 in FIGS. 3B and 3C, respectively. Data is written to the electronic device in the same manner as in the first embodiment.

Figure 4A:
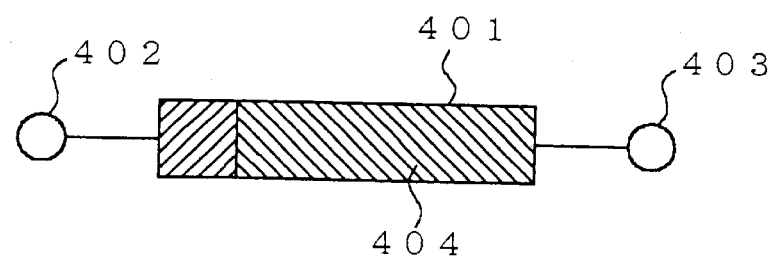
FIGS. 4A through 4C are fragmentary sections showing another alternative embodiment of the present invention.
Figure 4B:
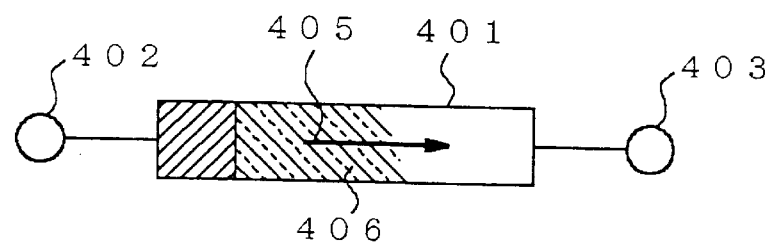
Figure 4C:
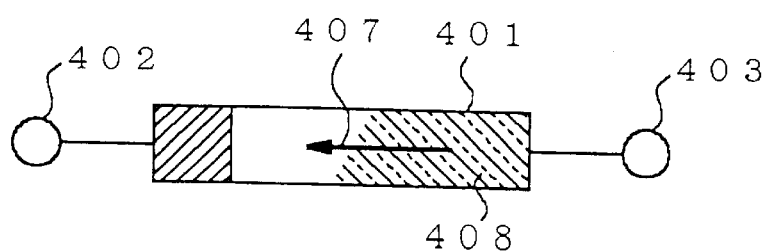

FIGS. 4A through 4C show a fourth embodiment of the electronic device in accordance with the present invention. As shown in FIG. 4A, the electronic device includes a memory core 401 formed on an insulative substrate, not shown, and formed of a conductive alloy that consists of two or more elements. Electrodes 402 and 403 are directly bonded to opposite ends of the memory core 401. In the illustrative embodiment, the electrode 402 plays the role of a sense electrode at the same time and is implemented by a densely doped semiconductor. Just after fabrication, the atoms of a diffusion element contained in the memory core 401 are uniformly distributed over the entire core 401, as indicated by the reference numeral 404.

Data is read out of the electronic device shown in FIG. 4A on the basis of the variation of junction resistance of the electrode or sense electrode 402. Specifically, as shown in FIG. 4B, when a diffusion element 406 with a high Schottky barrier densely concentrates in the vicinity of the sense electrode 402, junction resistance between the sense electrode 402 and the memory core 401 is relatively high. Conversely, as shown in FIG. 4C, assume that the density of the above element in the vicinity of the sense electrode 402 is low, i.e., the concentrated element, labeled 408, exists at the electrode 402 side. Then, the junction resistance between the sense electrode 402 and the memory core 401 is relatively low. Data is read out of the electronic device on the basis of such a difference in junction resistance. A current flowing from the electrode 402 to the electrode 403 and a current flowing from the latter to the former are designated by the reference numerals 405 and 407 in FIGS. 4B and 4C, respectively.

Figure 5A:
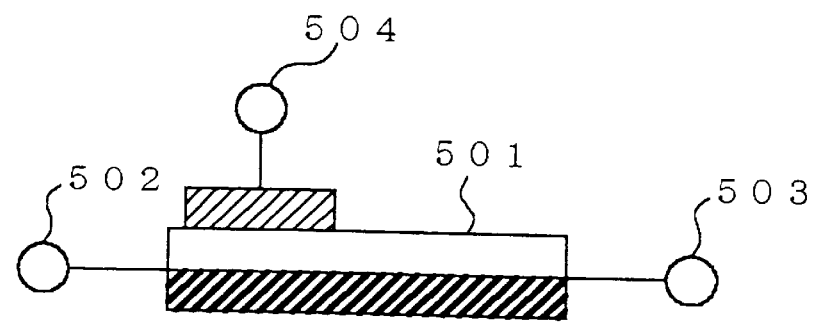
FIGS. 5A through 5C are fragmentary sections showing another alternative embodiment of the present invention.
Figure 5B:
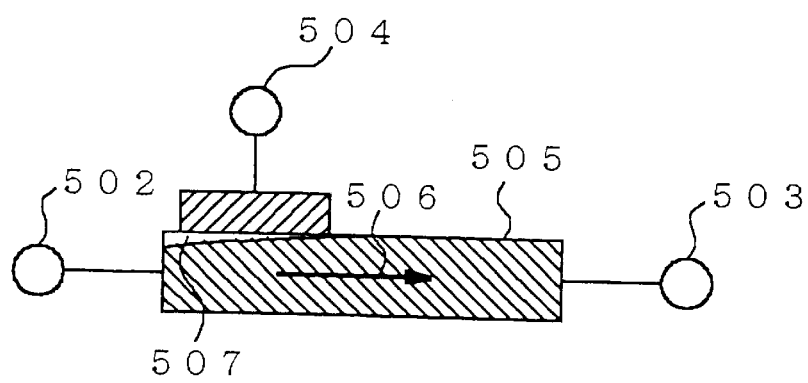
Figure 5C:
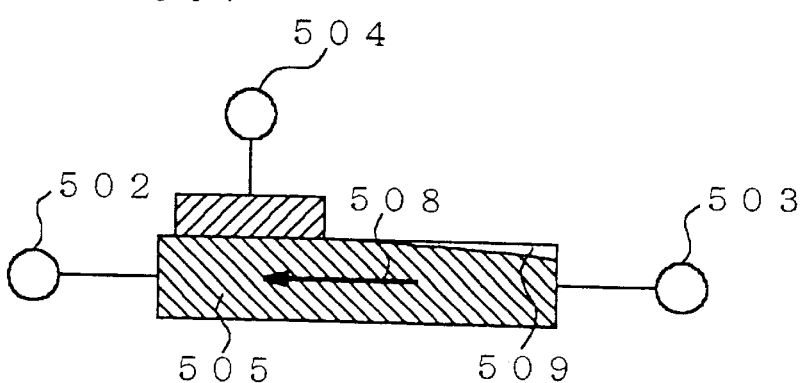

FIGS. 5A through 5C show a fifth embodiment of the electronic device in accordance with the present invention. As shown in FIG. 5A, the electronic device includes a memory core 501 formed on an insulative substrate, not shown, and formed of a conductive alloy that contains two or more elements. The memory core 501 is shown in a condition just after fabrication and as being made up of two layered components. Electrodes 502 and 503 are directly bonded to opposite ends of the memory core 501. A sense electrode 504 is also directly bonded to the memory core 501 in the vicinity of the electrode 502. After the entire memory core 501 has been covered with an insulation layer not shown, the two or more layers are mixed together by heat or electromigration with the result that the volume of the memory core 501 decreases. Consequently, a void 507 shown in FIG. 5B or a void 509 shown in FIG. 5C appears in the vicinity of the electrode 502 or 503, respectively. To cause the void 507 or 509 to appear at the sense electrode 504 side, the sense electrode 504 is formed of a substance exhibiting energy at the interface between the sense electrode 504 and the memory core 501 that is greater than energy at the interface between the core 501 and the substrate.

Data is read out of the electronic device shown in FIGS. 5A through 5C on the basis of electrical disconnection or an increase in resistance between the sense electrode 504 and the memory core 501 that is ascribable to the void 504. Specifically, as shown in FIG. 5B, the void 507 adjoining the sense electrode 504 electrically disconnects the sense electrode 504 and the memory core, labeled 505, reduced in volume due to mixture. Conversely, as shown in FIG. 5C, when the void 509 is remote from the sense electrode 504, the sense electrode 504 and memory core 501 are electrically connected to each other. Data is read out of the electronic device on the basis of such electrical connection. A current flowing from the electrode 502 to the electrode 503 and a current flowing from the latter to the former are designated by the reference numerals 506 and 508 in FIGS. 5B and 5C, respectively.

Figure 6A:
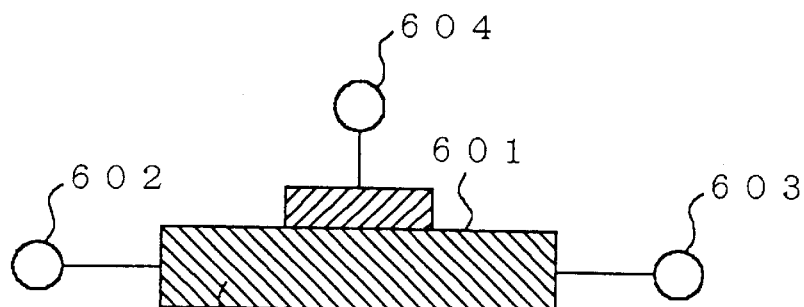
FIGS. 6A through 6C are fragmentary sections showing still another alternative embodiment of the present invention.
Figure 6B:
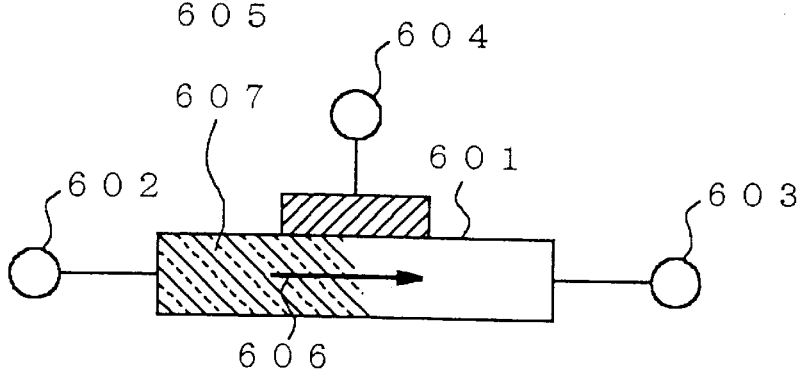
Figure 6C:
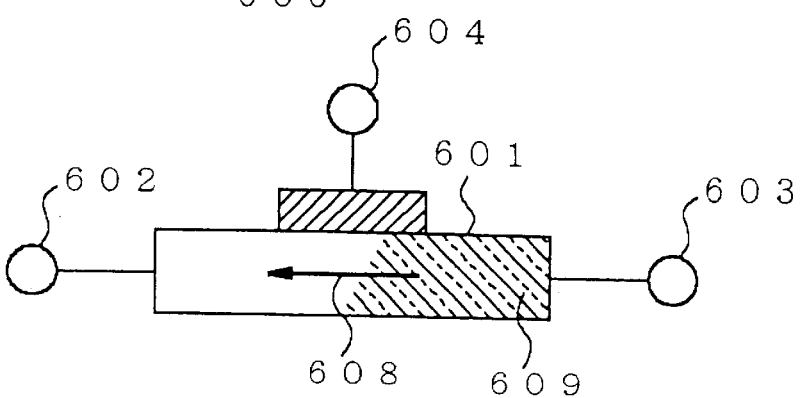

FIGS. 6A through 6C show a sixth embodiment of the electronic device in accordance with the present invention. As shown in FIG. 6A, the electronic device includes a memory core 601 formed on an insulative substrate, not shown, and formed of a conductive alloy that consists of two or more elements. Electrodes 602 and 603 are directly bonded to opposite ends of the memory core 501. A sense electrode 604 is also directly bonded to the intermediate point of the memory core 601. Just after fabrication, the atoms of a diffusion element contained in the memory core 601 are uniformly distributed over the entire core 601, as indicated by the reference numeral 605.

Data is read out of the electronic device shown in FIG. 6A on the basis of the variation of resistance of the memory core 601 between the sense electrode 604 and the electrode 602. Specifically, as shown in FIG. 6B, when a diffusion element 607 densely concentrates in the vicinity of the electrode 602, electric resistance between the sense electrode 604 and the electrode 602 is relatively high. Conversely, as shown in FIG. 6C, assume that the density of the above element in the vicinity of the electrode 602 is low, i.e., the concentrated element, labeled 609, exists at the electrode 602 side. Then, the electric resistance between the sense electrode 604 and the electrode 602 is relatively low. Data is read out of the electronic device on the basis of such a difference in electric resistance. A current flowing from the electrode 602 to the electrode 603 and a current flowing from the latter to the former are designated by the reference numerals 606 and 608 in FIGS. 6B and 6C, respectively.

The illustrative embodiments described so far are practicable with various kinds of substances, whether they be organic or inorganic, and various dimensions.

Figure 7A:
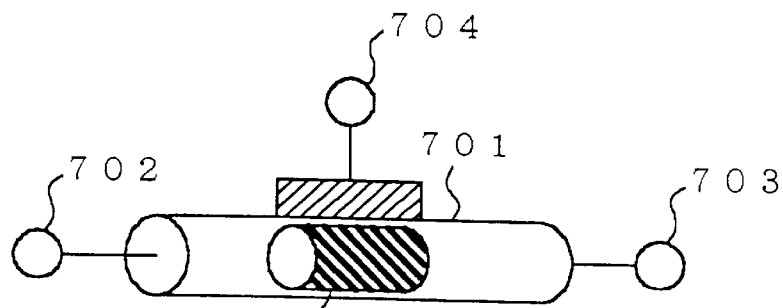
FIGS. 7A through 7C are fragmentary sections showing yet another alternative embodiment of the present invention.
Figure 7B:
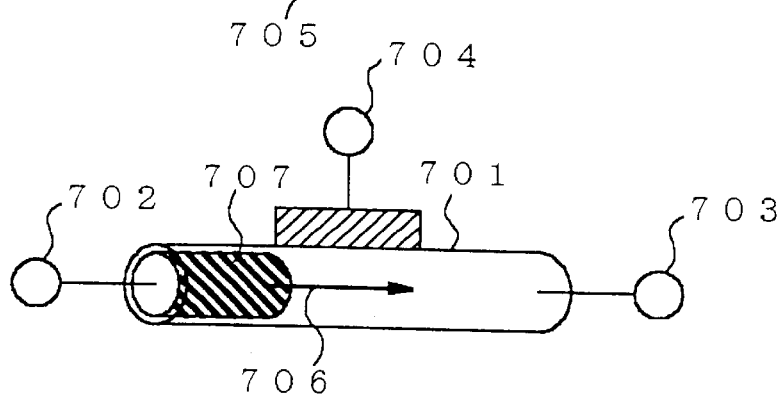
Figure 7C:
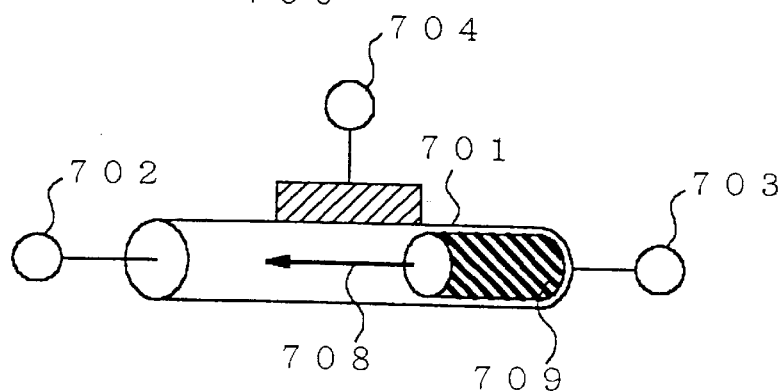

Reference will be made to FIGS. 7A through 7C for describing a seventh embodiment of the electronic device in accordance with the present invention. As shown in FIG. 7A, the electronic device includes a memory core 701 implemented by a carbon nano-tube that is mounted on an insulative substrate, not shown, and has a hollow core. Metal atoms 705 different in kind from the core of the nano-tube are inserted in part of the core. Electrodes 702 and 703 are directly bonded to opposite ends of the memory core 701. A sense electrode 704 is directly bonded to the intermediate point of the memory core 701.

Data is read out of the electronic device shown in FIGS. 7A through 7B in the same manner as in the sixth embodiment except for the size of the electric resistance. Specifically, as shown in FIG. 7B, when the metal atoms, labeled 707, exist in the vicinity of the electrode 702, electric resistance between the sense electrode 704 and the electrode 702 is relatively low. Conversely, as shown in FIG. 7C, when the metal atoms, labeled 709, exist in the vicinity of the electrode 703 remote from the electrode 702, the above electric resistance is relatively high. A current flowing from the electrode 702 to the electrode 703 and a current flowing from the latter to the former are designated by the reference numerals 706 and 708 in FIGS. 7B and 7C, respectively.

In the first to seventh embodiments described above, the electronic devices, whether they cause a diffusion element to migrate or cause a void to appear, each cause the optical reflection characteristic of the memory core to vary, as seen from the outside. This may be used to examine the operating condition of the electronic device or to transfer data to an optical interface.

Figure 8:
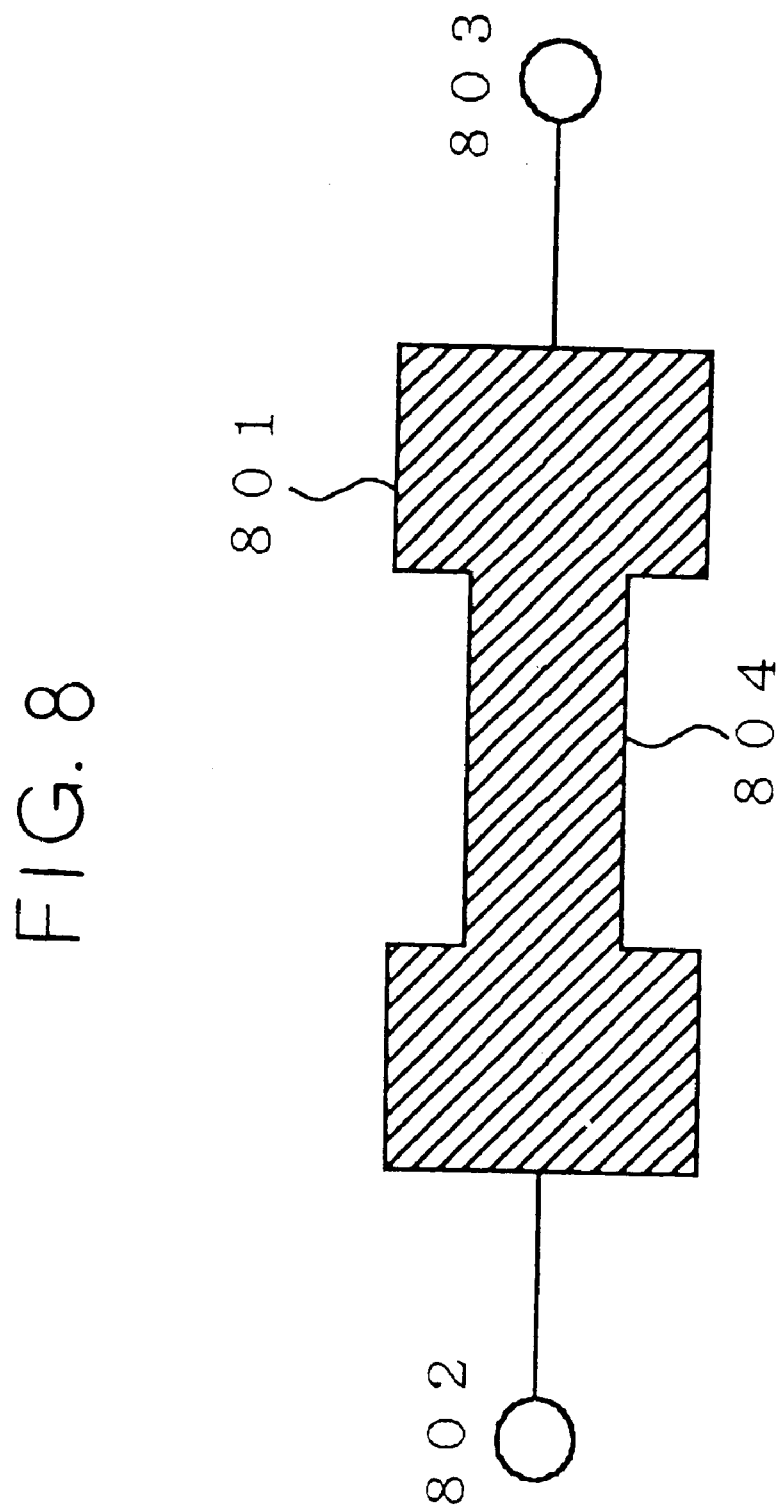
FIG. 8 is a fragmentary section showing a further alternative embodiment of the present invention.

More rapid operation and longer period of time of data storage are attainable if the memory core is formed of a substance whose diffusion coefficient is small at room temperature and if the temperature of the memory core is raised only at the time of writing. The memory core may even be heated to such a level that it at least partly fuses in order to achieve an extremely high writing speed. By using Joule heat derived from a current at the time of writing, it is possible to heat only a particular memory core, as will be described with reference to FIG. 8. In FIG. 8, a sense electrode is not shown.

As shown in FIG. 8, a memory core 801 includes a portion 804 smaller in diameter than the other portion. a current capable of causing the portion 804 to fuse is caused to flow between electrodes 802 and 803. In this manner, only the desired part of a memory core can be heated and caused to fuse only at the time of writing, so that rapid writing and long period of time storage are achieved at the same time.

For semipermanent data storage, the electronic device may be cooled off in order to obstruct the deterioration of data ascribable to heat diffusion instead of being heated at the time of operation. Further, the electronic device may be maintained at a preselected temperature over a preselected period of time in order to collectively delete data. Moreover, a plurality of sense electrodes may be used to construct a multilevel recording device, or easy lamination available with the electronic device may be taken advantage of to construct a multilevel device. This allows a super-dense storage device to be constructed far beyond the integration limit of a semiconductor device.

Figure 9A:
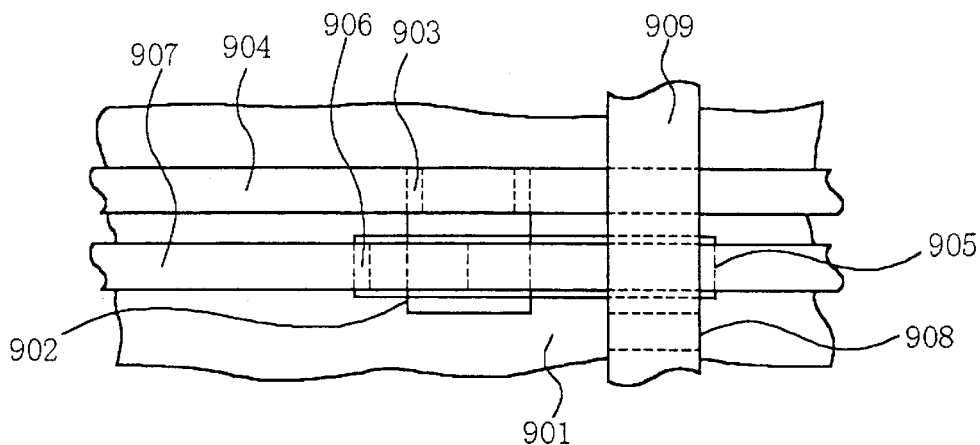
FIG. 9A is a projectional plan view showing a specific example of the electronic device in accordance with the present invention that constitutes a unit cell.
Figure 9B:
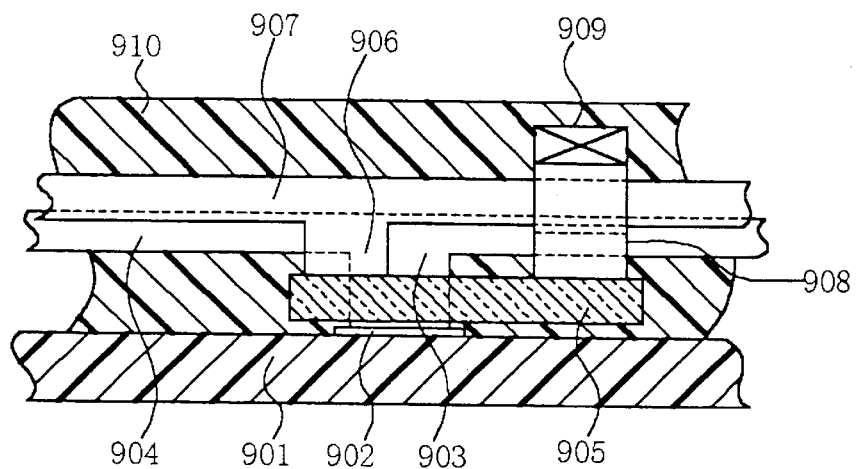
FIG. 9B is a projectional side elevation of the unit cell shown in FIG. 9A, as seen from the left.
Figure 9C:
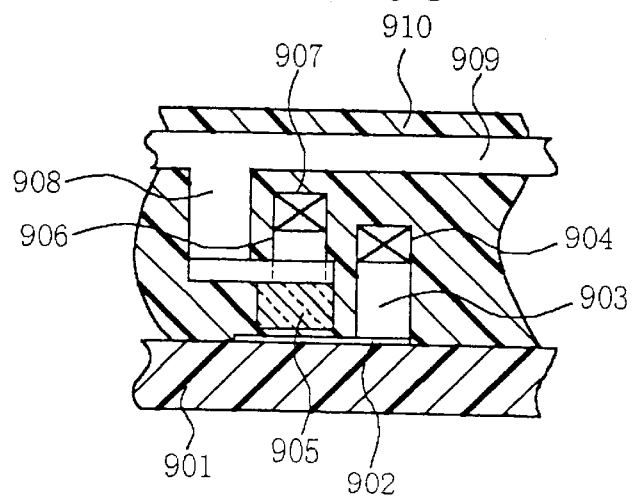
FIG. 9C is a projectional side elevation of the unit cell shown in FIG. 9A, as seen from the right.

FIGS. 9A through 9C show a specific example of the present invention. As shown, a sense electrode 902 implemented by titanium is first formed on an insulative substrate 901 formed of polycarbonate by sputtering and photolithography. Subsequently, an insulative protection film, i.e., $SiO_2$ film 910 is caused to grow by plasma CVD (Chemical Vapor Deposition). Further, a memory core 905 is formed by sputtering and photolithography by using Sn—Ni alloy, which contains 75 at % of Sn and 25 at % of Ni.

After the formation of the memory core 905, the $SiO_2$ film 910 is caused to grow by plasma CVD. Subsequently, holes for a connect line 903 and an electrode 906, respectively, are formed by photolithography. The connect line 903 and electrode 906 are then formed by sputtering and etching by using titanium.

Thereafter, a sense bit line 904 and a write bit line 907 are formed of Cu by sputtering and photolithography. Further, the $SiO_2$ film 910 is caused to grow by plasma CVD, and then a hole for an electrode 908 is formed. The electrode 908 is then formed by using titanium. This is followed by the formation of a Cu word line 909 using sputtering and photolithography. Finally, the entire laminate is covered with the $SiO_2$ film 910 by plasma CVD.

Figure 10A:
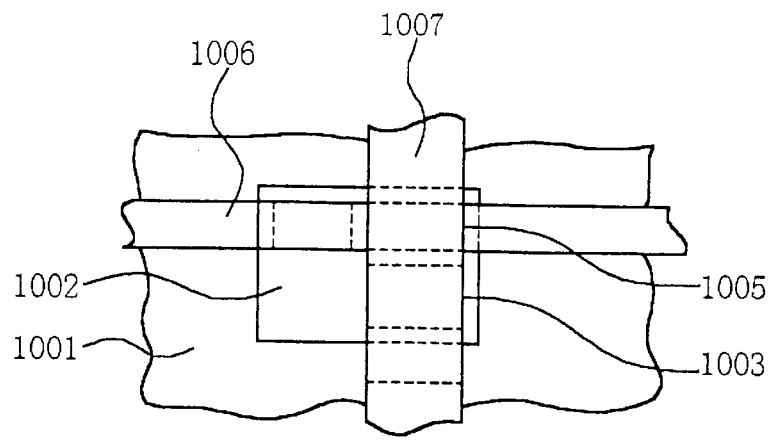
FIG. 10A is a projectional plan view showing another specific example of the electronic device in accordance with the present invention that constitutes a unit cell.
Figure 10B:
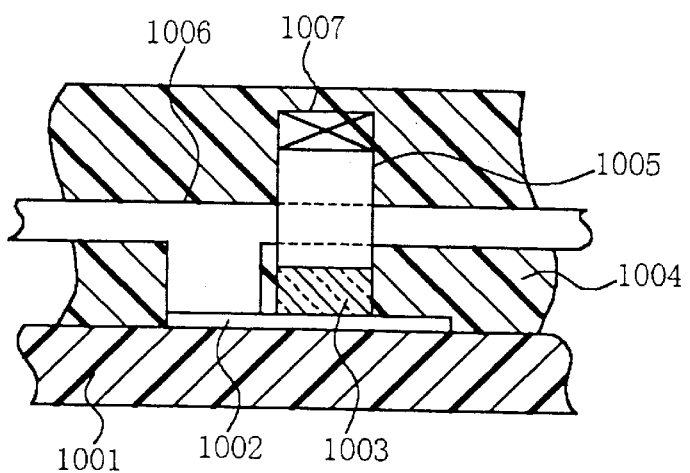
FIG. 10B is a projectional side elevation of the unit cell shown in FIG. 10A, as seen from the left.
Figure 10C:
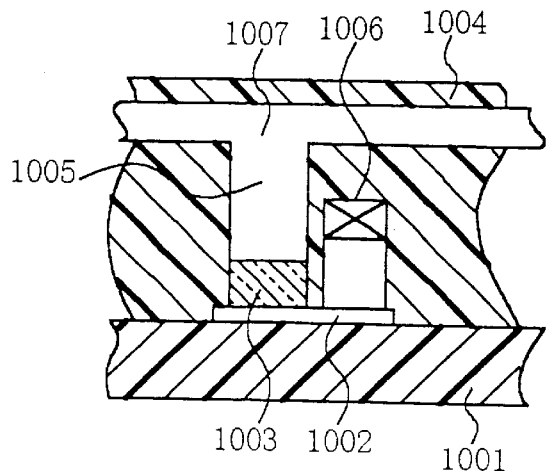
FIG. 10C is a projectional side elevation of the unit cell shown in FIG. 10A, as seen from the right.

Another specific example of the present invention will be described with reference to FIGS. 10A through 10C. As shown, An electrode 1002, which plays the role of a sense electrode at the same time, is formed on an insulative polycarbonate substrate 1001 by sputtering and photolithography. The electrode 1002 is formed of P-doped amorphous Si. Subsequently, a memory core 1003 is formed by sputtering and photolithography and implemented by Sn—Ni alloy, which contains 75 at % of Sn and 25 at % of Ni. Further, an insulative protection film or $SiO_2$ film 1004 is caused to grow by plasma CVD. A hole for a Cu bit line 1006 is formed by photolithography, so that the bit line 1006 can be connected to the electrode 1002. The bit line 1006 is then formed by sputtering and etching.

After the formation of the bit line 1006, the $SiO_2$ film 1004 is again caused to grow by plasma CVD. Subsequently, a hole for a Cu electrode 1005 is formed by photolithography. The Cu electrode 1005 and a word line 1007 are then formed integrally with each other by sputtering and etching. Finally, the entire laminate is covered with the $SiO_2$ film 1004.

The substances and processing technologies described above are only illustrative. For example, the insulative substrate 901 or 1001 may be implemented by single-crystal Si having an SiN film on its surface. The sense electrode 902 may be formed of, e.g., chromium while the sense bit line 904 maybe formed of aluminum. Further, the memory core 905 or 1003 may be formed of Au—Si alloy or similar metal alloy having a great difference in diffusion coefficient. In addition, the protection film 910 or 1004 covering the memory core 905 or 1003 may be implemented by, e.g., a carbon fluoride film.

Figure 11:
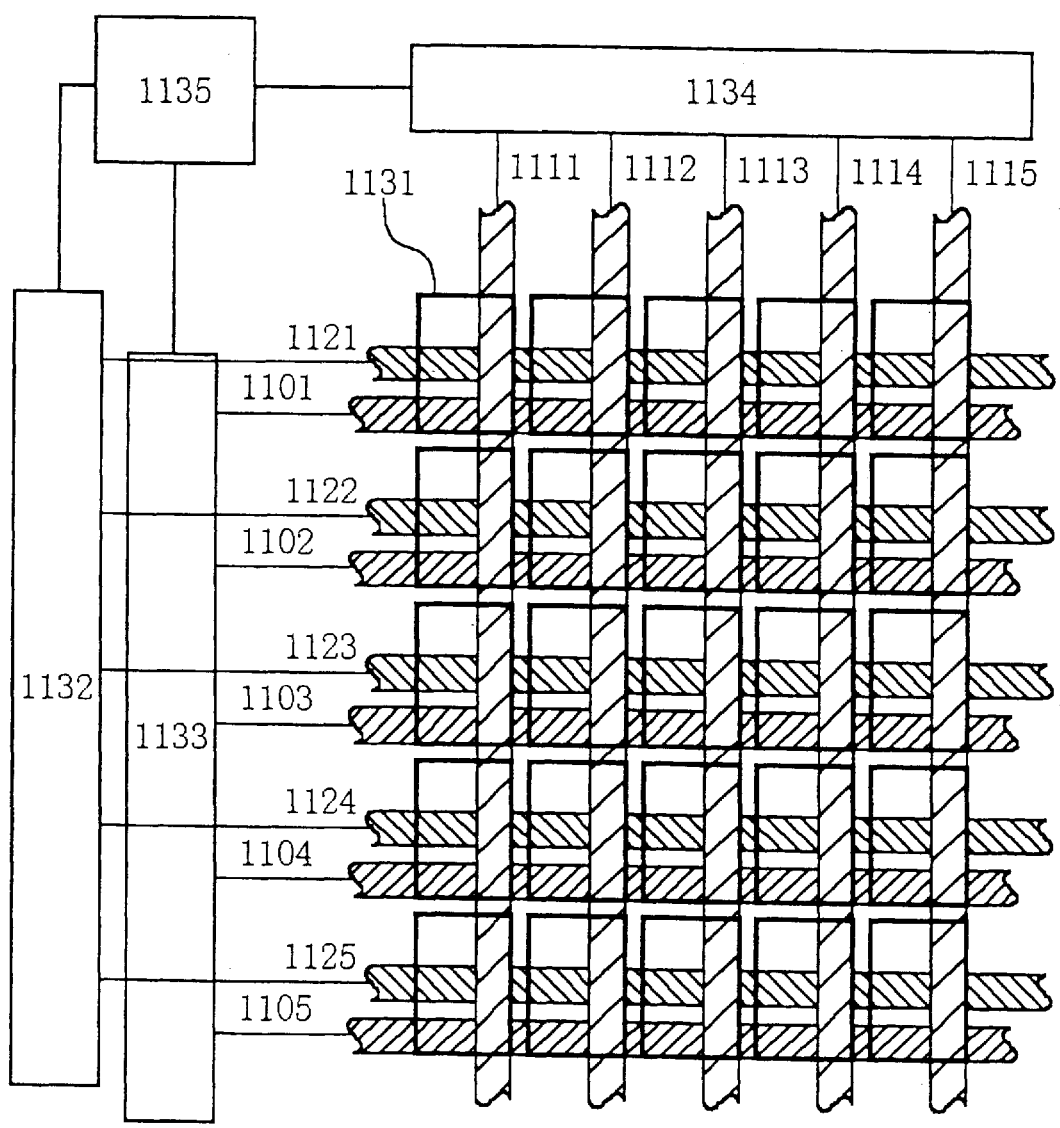
FIG. 11 is a plan view showing electronic devices each having the configuration of FIGS. 9A through 9C and arranged in arrays.

The electronic device or memory device shown in FIGS. 9A through 9C or 10A through 10C constitutes a unit cell. To deal with a great amount of data, it is necessary to arrange a number of such unit cells in vertical and horizontal arrays, i.e., rows and columns. Data should be written to or read out of any desired unit cell. FIG. 11 shows a specific arrangement using the unit cell described with reference to FIGS. 9A through 9C. As shown, sense bit lines 1121 through 1125 (904), write bit lines 1101 through 1105 (907) and word lines 1111 through 1115 (909) are arranged in rows and columns. The sense bit lines 1121 through 1125 and write bit lines 1101 through 1105 are connected to a sense column decoder 1132 and a write column decoder 1133, respectively. Further, the word lines 1111 and 1115 are connected to a row decoder 1134. The decoders 1132 through 1134 maybe identical with decoders conventional with a DRAM (Dynamic Random Access Memory) or similar semiconductor memory.

Figure 12:
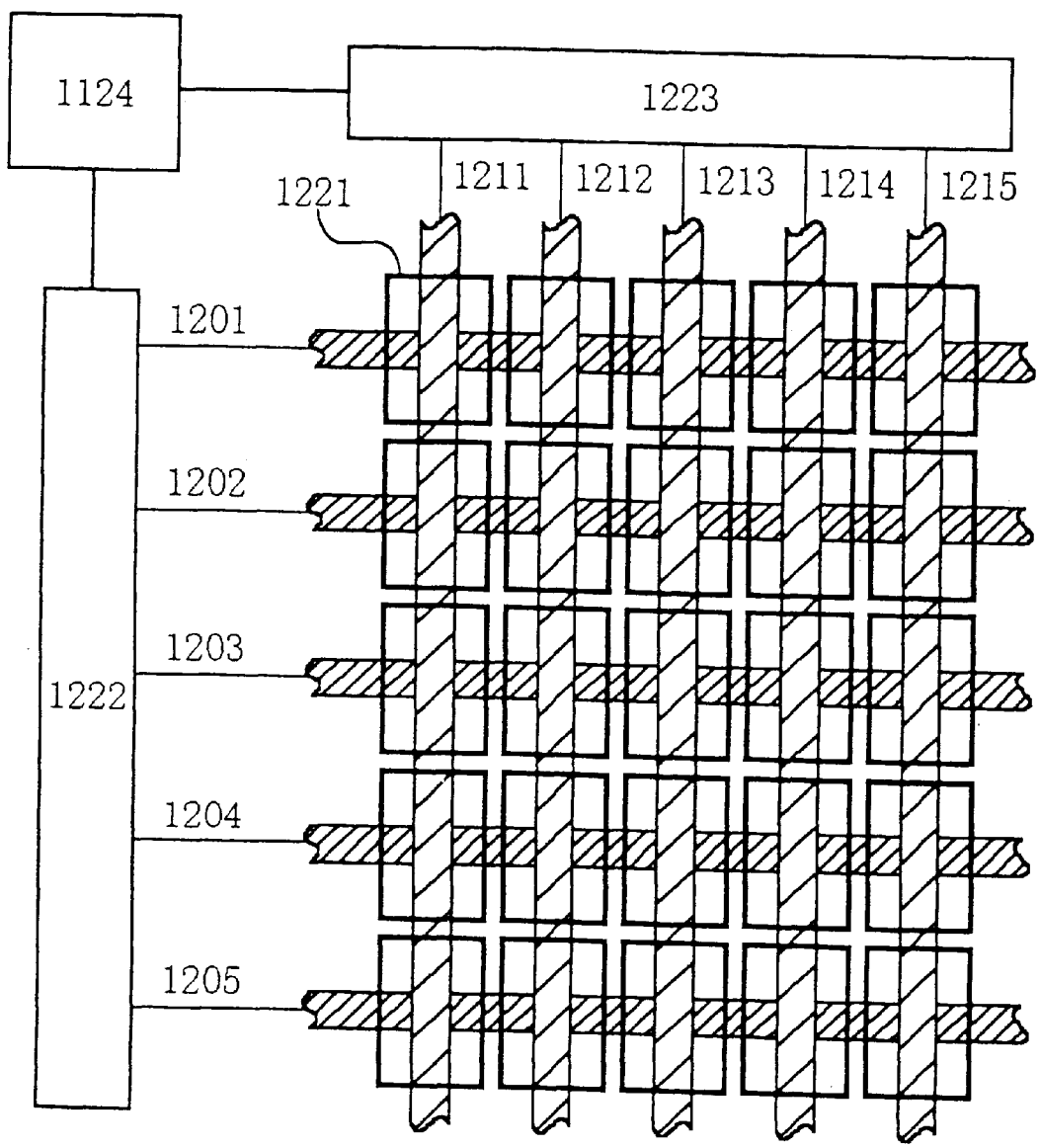
FIG. 12 is a plan view showing electronic devices each having the configuration of FIGS. 10A through 10C and arranged in arrays.

FIG. 12 shows another specific arrangement using the unit cell described with reference to FIGS. 10A through 10C. As shown, bit lines 1201 through 1205 (1006) and word lines 1211 through 1215 (1007) are arranged in rows and columns. The bit lines 1201 through 1205 and word lines 1211 through 1215 are connected to a column decoder 1222 and a row decoder 1223, respectively.

Figure 20:
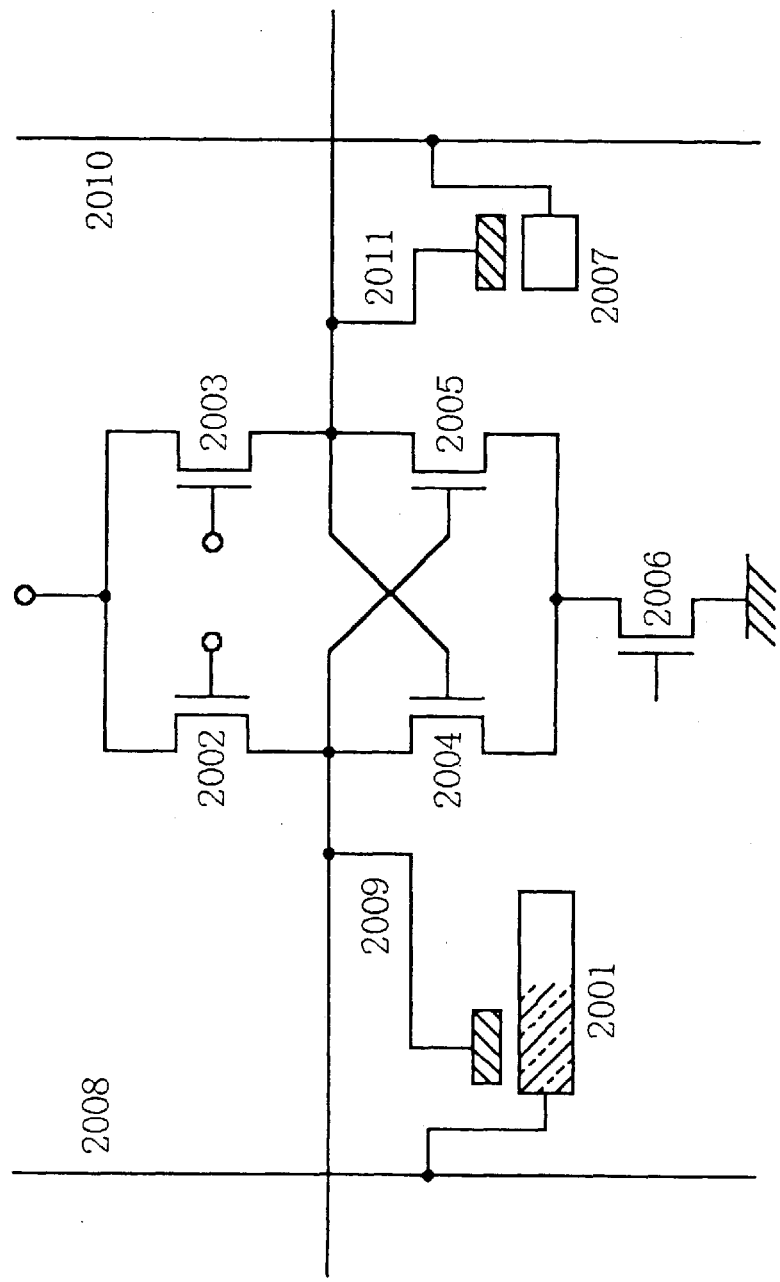
FIG. 20 is a circuit diagram showing a specific configuration of a sense amplifier circuit.

A sense amplifier 1135 shown in FIG. 11 or a sense amplifier 1224 shown in FIG. 12 is necessary for reading out data. Each sense amplifier 1135 or 1224 may also be identical with a sense amplifier customarily included in a DRAM or similar semiconductor memory. FIG. 20 shows a specific configuration of the sense amplifier 1135 or 1224. As shown, the sense amplifier includes several MOS (Metal Oxide Semiconductor) transistors 2002 through 2006 and a dummy device 2007 for comparison. In the configurations shown in FIGS. 11 and 12, the decoders and sense amplifier may be mounted on the same substrate as the recording device arrays or may be formed independently of the recording device arrays and combined later. As for such peripheral circuits, the semiconductors may be implemented by amorphous Si, poly-crystal Si or similar semiconductor instead of single-crystal Si, if desired. The configuration shown in FIG. 20 additionally includes a unit memory cell 2001, a word line 2008 selected, a bit line 2009 selected, a dummy word line 2010, and a dummy bit line 2011.

While the configurations shown in FIGS. 11 and 12 pertain to the first embodiment, they are similarly applicable to the other embodiments.

The operation of the electronic device shown in FIGS. 9A and 9B will be described in relation to the specific configuration of FIG. 11. To write data, the write column decoder 1133 and row decoder 1134 respectively select one write bit line and one word line in order to select a unit cell to which a desired address is attached. The writing speed depends on, e.g., the dimensions and composition of the memory core. For example, assume that the memory core 905 is 2 microns long, 0.5 micron wide, and 0.2 micron thick. Then, to invert the status of a single unit cell, it is necessary to feed a current of 5 mA for 80 nanoseconds.

To read data, the sense column decoder 1132 and row decoder 1134 respectively select one sense bit line and one word line in order to select a unit cell to which a desired address is attached. Assume that the diffusion element densely concentrates in the vicinity of the sense electrode 902, and that a current of 5 mA is caused to flow from the electrode 908 to the electrode 906 for 6 nanoseconds. Then, charge migration of the order of $10^{-15}$ coulombs is detected. No charge migration is detected when the density of the diffusion element is low in the vicinity of the sense electrode 902. A reading speed about ten times as high as the writing speed is attained (one bit for about 10 nanoseconds). To further increase the reading speed, the memory core 905 may be heated or caused to fuse and be reduced in size with the performance of the sense amplifier being enhanced.

The operation described above also holds true with the other configuration shown in FIG. 12.

In summary, it will be seen that the present invention provides an electronic device having various unprecedented advantages, as enumerated below.

(1) The electronic device implements a storage capacity, a reading speed and a writing speed comparable with those of a magnetic recording medium. In addition, the electronic device realizes a low production cost by simplifying production steps and using inexpensive substances.

(2) The electronic device obviates the need for mechanical movable portions and implements a nonvolatile memory more compact than a semiconductor memory.

(3) Because the array of such electronic devices can be formed without resorting to a high-temperature heating step. The array can therefore be easily laminated and allows an insulative substrate to be implemented by a broad range of substances. The electronic device therefore can realize recording density far higher than the recording density of a semiconductor memory.

(4) The electronic device can be formed on the surface of an organic resin exhibiting relatively high resistance to heat and has high adaptability.

Various modifications will become possible for those skilled in the art after receiving the teachings of the present disclosure without departing from the scope thereof.

What is claimed is:

1. In an electronic device comprising: a memory core formed of a substance that performs electromigration when a current flows therethrough, said electromigration varying at least part of a shape thereof or at least part of an element composition ratio thereof, wherein said memory core comprises a carbon nano-tube having a hollow core in part of which metal atoms are inserted.

2. In an electronic device comprising: a memory core formed of a substance that performs electromigration when a current flows therethrough, said electromigration varying at least part of a shape thereof or at least part of en element composition ratio thereof, wherein there are provided a first electrode for causing the current to flow through said memory core and either one of a second electrode for sensing a surface potential of said memory core and a third electrode for sensing an electric resistance or a junction resistance of said memory core.

3. The electronic device as claimed in claim 2, wherein said second electrode is insulated from said memory core.

4. The electronic device as claimed in claim 2, wherein said third electrode is directly bonded to said memory core.

5. In an integrated electronic device comprising a plurality of electronic devices arranged on a single substrate, each of said plurality of electronic devices comprising a memory core formed of a substance that performs electromigration when a current flows therethrough, said electromigration varying at least part of a shape thereof or at least part of an element composition ratio thereof, wherein said memory core comprises a carbon nano-tube having a hollow core in part of which metal atoms are inserted.

6. In an integrated electronic device comprising a plurality of electronic devices arranged on a single substrate, each of said plurality of electronic devices comprising a memory core formed of a substance that performs electromigration when a current flows therethrough, said electromigration varying at least part of a shape thereof or at least part of an element composition ratio thereof, wherein there are provided a first electrode for causing the current to flow through said memory core and either one of a second electrode for sensing a surface potential of said memory core and a third electrode for sensing an electric resistance or a junction resistance of said memory core.

7. The electronic device as claimed in claim 6, wherein said second electrode is insulated from said memory core.

8. The electronic device as claimed in claim 6, wherein said third electrode is directly bonded to said memory core.

9. In an integrated electronic device comprising a plurality of electronic devices, each of which comprises a memory core formed of a substance that performs, when a current flows therethrough, electromigration and varies in at least part of a shape thereof or at least part of an element composition ratio thereof, arranged on a single substrate in rows and columns, said plurality of electronic devices each further comprise a first electrode for causing the current to flow through said memory core and either one of a second electrode for sensing a surface potential of said memory core and a third electrode for sensing an electric resistance or a junction resistance of said memory core, and
    a bit line and a word line connected to one of said first electrode, said second electrode and said third electrode are selected to thereby designate an associated one of said plurality of electronic devices to be accessed.

10. The electronic device as claimed in claim 9, wherein said second electrode is insulated from said memory core.

11. The electronic device as claimed in claim 9, wherein said third electrode is directly bonded to said memory core.

12. The electronic device as claimed in claim 9, wherein a decoder circuit for selecting the bit line and the word line is arranged on the substrate.

13. In an integrated electronic device comprising a plurality of electronic devices arranged on a single substrate, each of said electronic devices comprising a memory core formed of a substance that performs electromigration when a current flows therethrough, said electromigration varying at least part of a shape thereof or at least part of an element composition ratio thereof, each of said plurality of electronic devices further comprising a sensing amplifier circuit arranged on said substrate for sensing a surface potential of said memory core, wherein said electronic devices are arranged on the single substrate in rows and columns, and wherein a bit line and a word line are connected to one of a first electrode, a second electrode or a third electrode which is selected to thereby designate an associated one of said electronic device to be accessed.

14. The electronic device as claimed in claim 13, wherein a decoder circuit for selecting the bit line and the word line is arranged on the substrate.

15. In a method of writing data in an electronic device comprising a memory core formed of a substance that performs, when a current flows therethrough, electromigration and varies in at least part of a shape thereof or at least part of an element composition ratio thereof, said electronic device further comprises a first electrode for causing the current to flow through said memory core and either one of a second electrode for sensing a surface potential of said memory core and a third electrode for sensing an electric resistance or a junction resistance of said memory core.

16. In a method of reading data out of an electronic device comprising a memory core formed of a substance that performs, when a current flows therethrough, electromigration and varies in at least part of a shape thereof or at least part of an element composition ratio thereof, said electronic device further comprises a first electrode for causing the current to flow through said memory core and either one of a second electrode for sensing a surface potential of said memory core and a third electrode for sensing an electric resistance or a junction resistance of said memory core,
    said second electrode is insulated from said memory core, and
    an amount of charge migration to occur in said second electrode is sensed to thereby read the data out of said memory core.

17. In a method of reading data out of an electronic device comprising a memory core formed of a substance that performs, when a current flows therethrough, electromigration and varies in at least part of a shape thereof or at least part of an element composition ratio thereof, said electronic device further comprises a first electrode for causing the current to flow through said memory core and either one of a second electrode for sensing a surface potential of said memory core and a third electrode for sensing an electric resistance or a junction resistance of said memory core,
    said third electrode is directly bonded to said memory core, and
    a variation of a junction resistance or an electric resistance between said third electrode and said memory core is sensed to thereby read the data out of said memory core.

18. In a method of reading data out of an electronic device comprising a memory core formed of a substance that performs, when a current flows therethrough, electromigration and varies in at least part of a shape thereof or at least part of an element composition ratio thereof, said electronic device further comprises a first electrode for causing the current to flow through said memory core and either one of a second electrode for sensing a surface potential of said memory core and a third electrode for sensing an electric resistance or a junction resistance of said memory core,
    said second electrode is insulated from said memory core, and
    a variation of capacitance between said second electrode and said memory core is sensed to thereby read the data out of said memory core.

19. In a method of writing data in an electronic device comprising a memory core formed of a substance that performs, when a current flows therethrough, electromigration and varies in at least part of a shape thereof or at least part of an element composition ratio thereof, said electronic device further comprises a first electrode for causing the current to flow through said memory core and either one of a second electrode for sensing a surface potential of said memory core and a third electrode for sensing an electric resistance or a junction resistance of said memory core, and
    a temperature of at least part of said memory core is raised at a time of data writing.

20. In an electronic device comprising a memory core formed of a substance that has electromigration when a current flows therethrough, said electromigration varying at least part of a shape thereof or at least part of an element composition thereof, two electrodes for feeding current, at least one of said electrodes being formed by a semiconductor for sensing a variation of a junction resistance of said memory core.

21. In an electronic device comprising a memory core formed of a substance that has electromigration when a current flows therethrough, said electromigration varying at least part of a shape thereof or at least part of an element composition thereof, two electrodes for feeding current, and an electrode for sensing a variation of a surface potential, an electric resistance, or a junction resistance.

22. In an electronic device comprising a memory core formed of a substance that has electromigration when a current flows therethrough, said electromigration varying at least part of a shape thereof or at least part of an element composition thereof, a temperature of at least part of said memory core raising at a time of data writing.

23. In a method of writing data in an electronic device comprising a memory core formed of a substance that has electromigration when a current flows therethrough, said electromigration varying at least part of a shape thereof or at least part of an element composition thereof, a temperature of at least part of said memory core raising at a time of data writing.

24. In an electronic device comprising a memory core formed of a substance that has electromigration when a current flows therethrough, said electromigration varying at least part of a shape thereof or at least part of an element composition thereof, a temperature of at least part of said memory core raising at a time of data writing to thereby cause said at least part of said memory core to melt.

25. In a method of writing data in an electronic device comprising a memory core formed of a substance that has electromigration when a current flows therethrough, said electromigration varying at least part of a shape thereof or at least part of an element composition thereof, a temperature of at least part of said memory core raising at a time of data writing to cause said at least part of said memory core to melt.

* * * * *